United States Patent
Zhu et al.

(10) Patent No.: US 10,601,183 B2
(45) Date of Patent: Mar. 24, 2020

(54) ELECTRICAL CONNECTOR HAVING A CONNECTION KIT

(71) Applicant: Cheng Uei Precision Industry Co., Ltd., New Taipei (TW)

(72) Inventors: Feng Zhu, Dong-Guan (CN); Dao-Rui Sun, Dong-Guan (CN); Bo Lei, Dong-Guan (CN)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 57 days.

(21) Appl. No.: 16/005,714

(22) Filed: Jun. 12, 2018

(65) Prior Publication Data

US 2019/0379165 A1   Dec. 12, 2019

(51) Int. Cl.
| | |
|---|---|
| H01R 13/648 | (2006.01) |
| H01R 13/6587 | (2011.01) |
| H01R 12/52 | (2011.01) |
| H01R 24/60 | (2011.01) |
| H01R 13/66 | (2006.01) |
| H01R 43/20 | (2006.01) |
| H01R 13/502 | (2006.01) |
| H01R 13/6594 | (2011.01) |
| H01R 107/00 | (2006.01) |

(52) U.S. Cl.
CPC ......... *H01R 13/6587* (2013.01); *H01R 12/52* (2013.01); *H01R 13/502* (2013.01); *H01R 13/6594* (2013.01); *H01R 13/665* (2013.01); *H01R 24/60* (2013.01); *H01R 43/20* (2013.01); *H01R 2107/00* (2013.01); *H05K 2201/09145* (2013.01)

(58) Field of Classification Search
CPC ........................... H01R 24/60; H01R 12/7082
USPC ............................................. 439/607.07, 660
See application file for complete search history.

(56) References Cited

U.S. PATENT DOCUMENTS

| | | | | |
|---|---|---|---|---|
| 8,968,031 B2 * | 3/2015 | Simmel | ............... | H01R 13/659 |
| | | | | 439/660 |
| 9,853,402 B2 * | 12/2017 | Talalayev | ........... | H01R 12/7082 |
| 9,871,327 B2 * | 1/2018 | Simmel | ............... | H01R 13/659 |
| 9,972,943 B2 * | 5/2018 | Jeon | ................... | H01R 13/6581 |
| D823,809 S * | 7/2018 | Zhu | ............................. | D13/147 |
| 10,263,365 B2 * | 4/2019 | Kato | .................... | H01R 13/629 |
| 2013/0330976 A1 * | 12/2013 | Simmel | ............... | H01R 13/659 |
| | | | | 439/660 |
| 2015/0263465 A1 * | 9/2015 | Zhang | .................... | H01R 24/60 |
| | | | | 439/676 |
| 2017/0093099 A1 * | 3/2017 | Talalayev | ........... | H01R 12/7082 |

* cited by examiner

*Primary Examiner* — Hae Moon Hyeon
(74) *Attorney, Agent, or Firm* — Cheng-Ju Chiang

(57) ABSTRACT

An electrical connector includes an insulating base, a plurality of conductive terminals, a circuit board, at least one connection kit, an outer shell receiving the insulating base, and a shielding plate. The plurality of the conductive terminals are inserted to the insulating base. The circuit board is mounted on the insulating base. At least one portion of one end of the circuit board extends outward to form at least one tongue board. The plurality of the golden fingers are connected with the plurality of the conductive terminals. The at least one connection kit is integrally injection-molded by a metal injection molding technology. The at least one connection kit sleeves around the at least one tongue board. The shielding plate is covered on the circuit board.

10 Claims, 7 Drawing Sheets

ELECTRICAL CONNECTOR HAVING A CONNECTION KIT

BACKGROUND OF THE INVENTION

1. Field of the Invention

The present invention generally relates to an electrical connector, and more particularly to an electrical connector having a connection kit.

2. The Related Art

Generally, an electrical connector includes a universal serial bus (USB) connector. The universal serial bus connector is a common input-output interface, and the universal serial bus connector supports a hot plug function and a plug-and-play function. The universal serial bus connector plays a convenient effect in every field and in daily life.

A connection end of a conventional universal serial bus connector uses a connection terminal to be acted as a main transmission component. A tongue portion is mainly protruded from a circuit board of the conventional universal serial bus connector. In use, because two circuit boards of a conventional male universal serial bus connector and a conventional female universal serial bus connector contact with each other directly in an insertion and withdrawal process that easily makes the two circuit boards abraded mutually to cause defects of the conventional male universal serial bus connector and the conventional female universal serial bus connector in use.

Thus, in order to solve the above-mentioned problems, an innovative electrical connector must be provided, the innovative electrical connector is a universal serial bus (USB) connector, a tongue portion of the innovative universal serial bus connector is made to be protected for increasing a usage life of the universal serial bus connector.

SUMMARY OF THE INVENTION

An object of the present invention is to provide an electrical connector. The electrical connector includes an insulating base, a plurality of conductive terminals, a circuit board, at least one connection kit, an outer shell receiving the insulating base together with the plurality of the conductive terminals and the circuit board, and a shielding plate. The plurality of the conductive terminals are inserted to the insulating base and arranged at regular intervals. The circuit board is mounted on the insulating base. The plurality of the conductive terminals are inserted to the circuit board. At least one portion of one end of the circuit board extends outward away from a center of the circuit board to form at least one tongue board. A front end of at least one surface of the at least one tongue board has a plurality of spaced golden fingers arranged side by side. The plurality of the golden fingers are connected with the plurality of the conductive terminals by circuits of the circuit board. The at least one connection kit is integrally injection-molded by a metal injection molding technology. The at least one connection kit sleeves around the at least one tongue board of the circuit board. The at least one connection kit is of a hollow shape with an accommodating space being surrounded inside the at least one connection kit. The plurality of the golden fingers are exposed out from the accommodating space. The shielding plate is covered on the circuit board to make the insulating base and the circuit board sealed between the shielding plate and the outer shell.

As described above, in an insertion and withdrawal process of the electrical connector, the circuit board is protected from abrasions by virtue of the at least one connection kit being integrally injection-molded by the metal injection molding technology and the at least one connection kit being fastened to the circuit board, so a usage life of the circuit board is increased, and simultaneously, the shielding plate is utilized by the electrical connector for preventing an internal and external high-frequency noises and electromagnetic interferences. As a result, a steady transmission of the electrical connector is realized.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
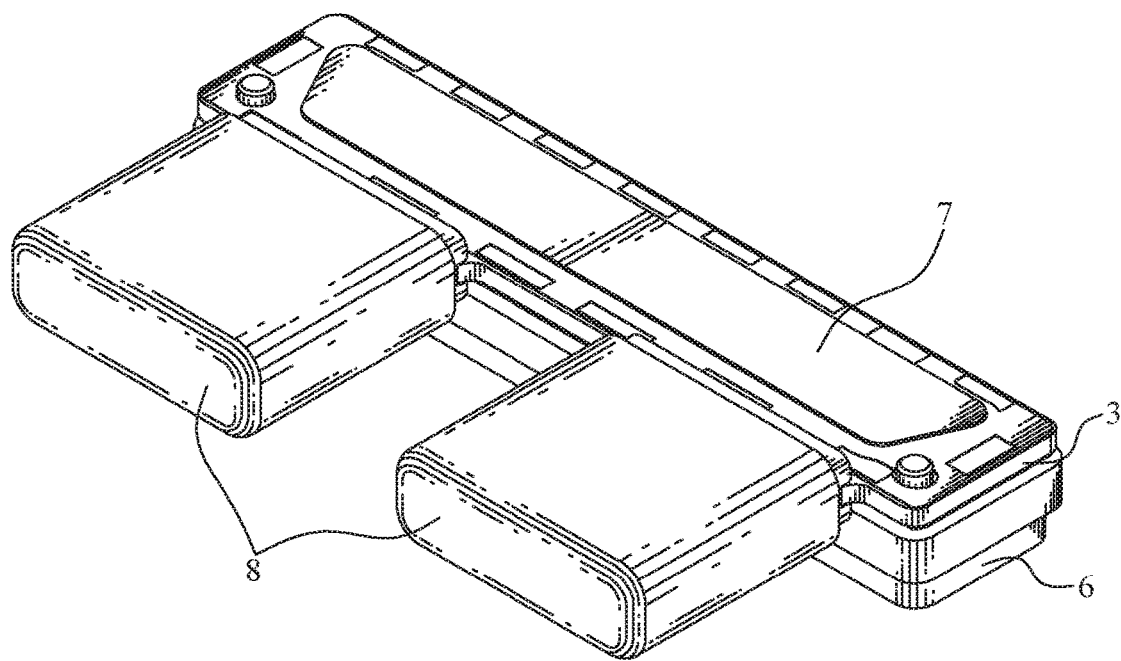
FIG. 1 is a perspective view of an electrical connector in accordance with a preferred embodiment of the present invention.
Figure 2:
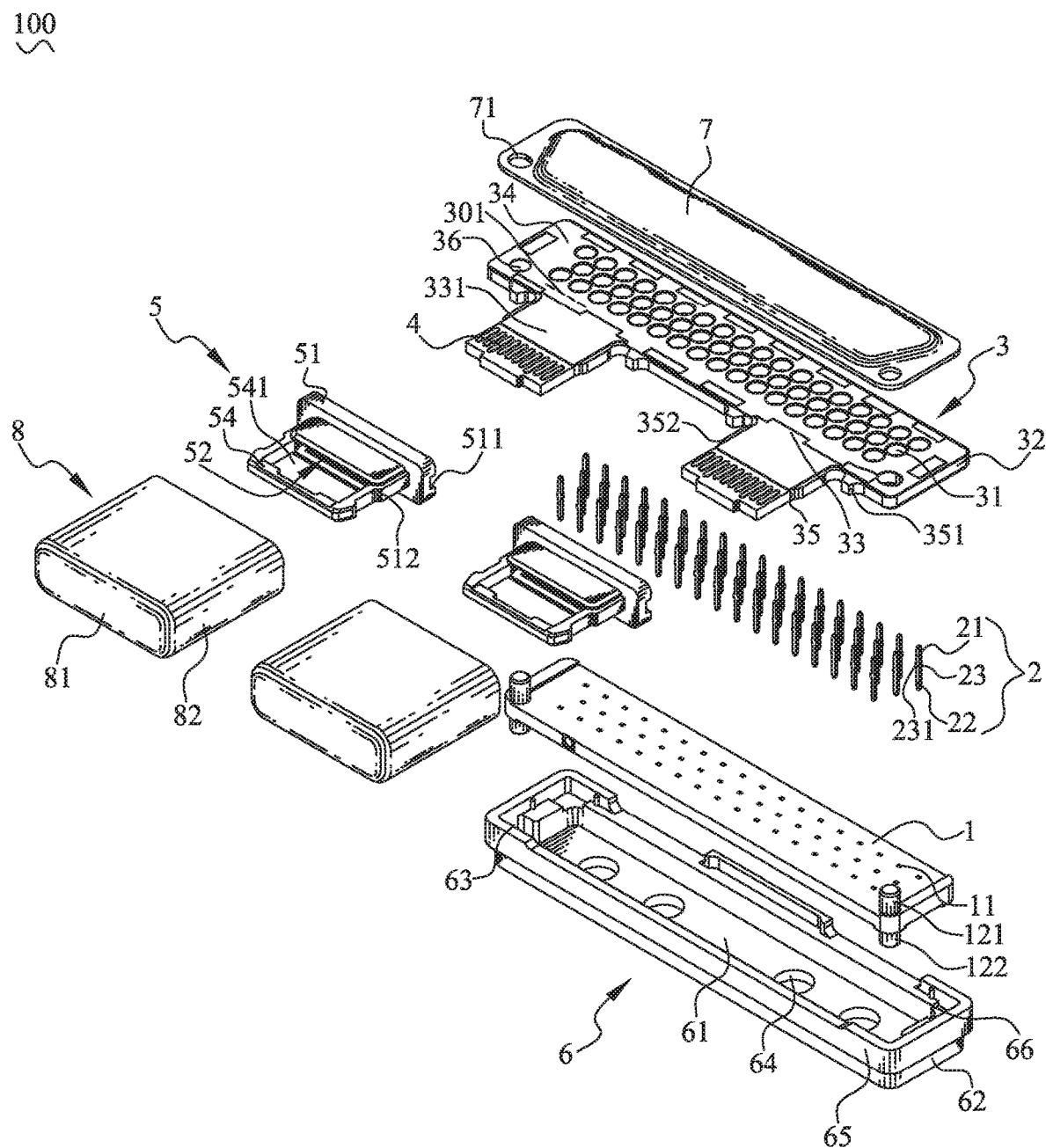
FIG. 2 is an exploded view of the electrical connector of FIG. 1.
Figure 3:
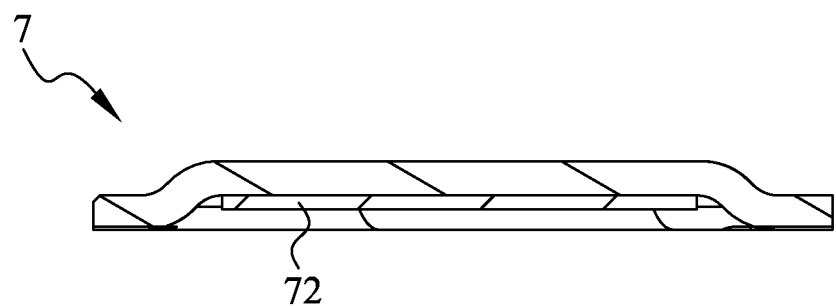
FIG. 3 is a partially enlarged sectional view showing a shielding plate of the electrical connector of FIG. 2.

With reference to FIG. 1 to FIG. 3, an electrical connector 100 in accordance with a preferred embodiment of the present invention is shown. The electrical connector 100 is a universal serial bus (USB) connector. The electrical connector 100 includes an insulating base 1, a plurality of conductive terminals 2, a circuit board 3, at least one connection kit 5, an outer shell 6, a shielding plate 7 and at least one outer cover 8. In the preferred embodiment, the electrical connector 100 includes two connection kits 5 and two outer covers 8.

Referring to FIG. 2, the insulating base 1 is a rectangular plastic seat. A middle of the insulating base 1 opens a plurality of first through-holes 11 for fastening the plurality of the conductive terminals 2 in the plurality of the first through-holes 11. Two opposite sides of a front of a top surface of the insulating base 1 protrude upward to form two first fastening pillars 121. Two opposite sides of a front of a bottom surface of the insulating base 1 protrude downward to form two second fastening pillars 122. The two first fastening pillars 121 and the two second fastening pillars 122 are used for being assembled with the plurality of the conductive terminals 2, the circuit board 3, the at least one connection kit 5, the outer shell 6, the shielding plate 7 and the at least one outer cover 8 into the complete electrical connector 100.

The plurality of the conductive terminals 2 are inserted to the insulating base 1 and arranged at regular intervals. Each of the plurality of the conductive terminals 2 has a conducting portion 21, a connecting portion 22, and a fastening portion 23 connected between the conducting portion 21 and the connecting portion 22. Each of the plurality of the conductive terminals 2 is of a linear cylinder shape. An upper portion of each of the plurality of the conductive terminals 2 is defined as the conducting portion 21. A lower portion of each of the plurality of the conductive terminals 2 is defined as the connecting portion 22. A middle of each of the plurality of the conductive terminals 2 is defined as the fastening portion 23. Two opposite sides of the fastening portion 23 slightly protrude outward to form two interfering portions 231. The two interfering portions 231 project beyond two opposite side surfaces of the conducting portion 21, respectively. The two interfering portions 231 project beyond two opposite side surfaces of the connecting portion 22, respectively.

Referring to FIG. 2 to FIG. 4 again, the circuit board 3 is mounted on the insulating base 1. In the preferred embodiment, the circuit board 3 is a rectangular board. The circuit board 3 conforms to a USB (universal serial bus) Type C specification. A middle of the circuit board 3 opens a plurality of second through-holes 31 corresponding to the plurality of the first through-holes 11 of the insulating base 1 separately. The plurality of the second through-holes 31 are used for receiving the conducting portions 21 of the plurality of the conductive terminals 2 which are assembled to the insulating base 1. At least one portion of one end of the circuit board 3 extends outward away from a center of the circuit board 3 to form at least one tongue board 35. The circuit board 3 includes a main body 32, two metal layers 33 and two coating layers 34. A top surface and a bottom surface of the main body 32 are coated with the two metal layers 33, respectively. One of the two coating layers 34 is coated on one of the two metal layers 33, and the other coating layer 34 is coated under the other metal layer 33. At least one portion of a front surface of the main body 32 extends frontward to form the at least one tongue board 35. Two portions of the front surface of the main body 32 protrude frontward to form two fastening blocks 351 spaced from each other. The at least one tongue board 35 is located between the two fastening blocks 351. Two opposite sides of a rear of the at least one tongue board 35 extend oppositely to form two buckling portions 352. A front end of at least one surface of the at least one tongue board 35 has a plurality of spaced golden fingers 4 arranged side by side.

Each of the two metal layers 33 of the at least one tongue board 35 extends frontward to a middle of the at least one tongue board 35 to form a fusion surface 331 covered to a latter half of the at least one tongue board 35. Two sides of the circuit board 3 open two first fastening holes 36 corresponding to the two first fastening pillars 121 of the insulating base 1, respectively.

In the preferred embodiment, two sides of the front surface of the main body 32 protrude frontward to form two tongue boards 35 spaced from each other. Four portions of the front surface of the main body 32 protrude frontward to form two pairs of fastening blocks 351. One of the two tongue boards 35 is located between one pair of the fastening blocks 351, and the other tongue board 35 is located between the other pair of the fastening blocks 351. Front ends of a top surface and a bottom surface of each of the two tongue boards 35 have the plurality of golden fingers 4. The golden fingers 4 of the top surface of each of the two tongue boards 35 are arranged transversely. The golden fingers 4 of the bottom surface of each of the two tongue boards 35 are arranged transversely. The plurality of the golden fingers 4 are connected with the plurality of the conductive terminals 2 by circuits 301 of the circuit board 3 to make an electrical conduction between the plurality of the golden fingers 4 and the plurality of the conductive terminals 2 and transmit signals. Comparing with terminals (not shown) which are used formerly, the plurality of the conductive terminals 2 have a high transmission performance and a low contact resistance performance to realize a signal connection in use.

In the preferred embodiment, the two metal layers 33 of the two tongue boards 35 extend frontward to middles of the two tongue boards 35 to form two fusion surfaces 331 covered to latter halves of the two tongue boards 35, respectively.

Figure 6:
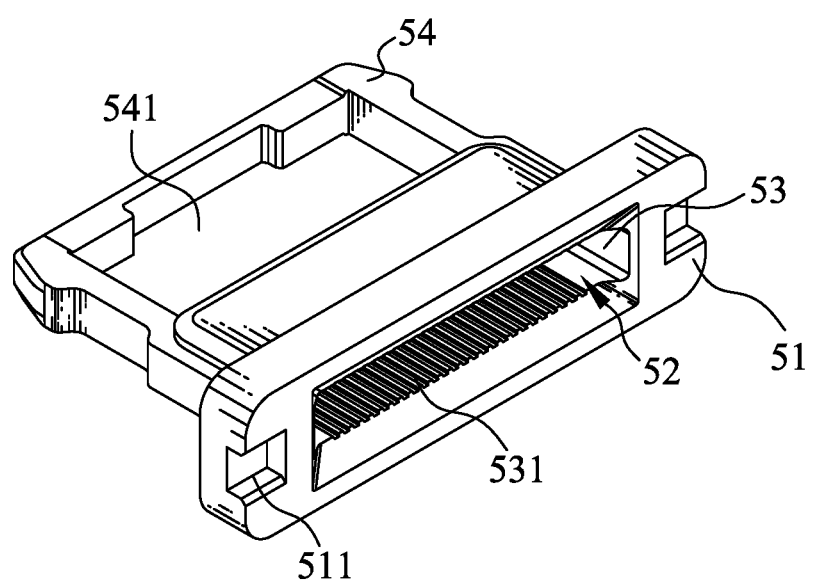
FIG. 6 is a partially enlarged perspective view of a connection kit of the electrical connector of FIG. 2.
Figure 7:
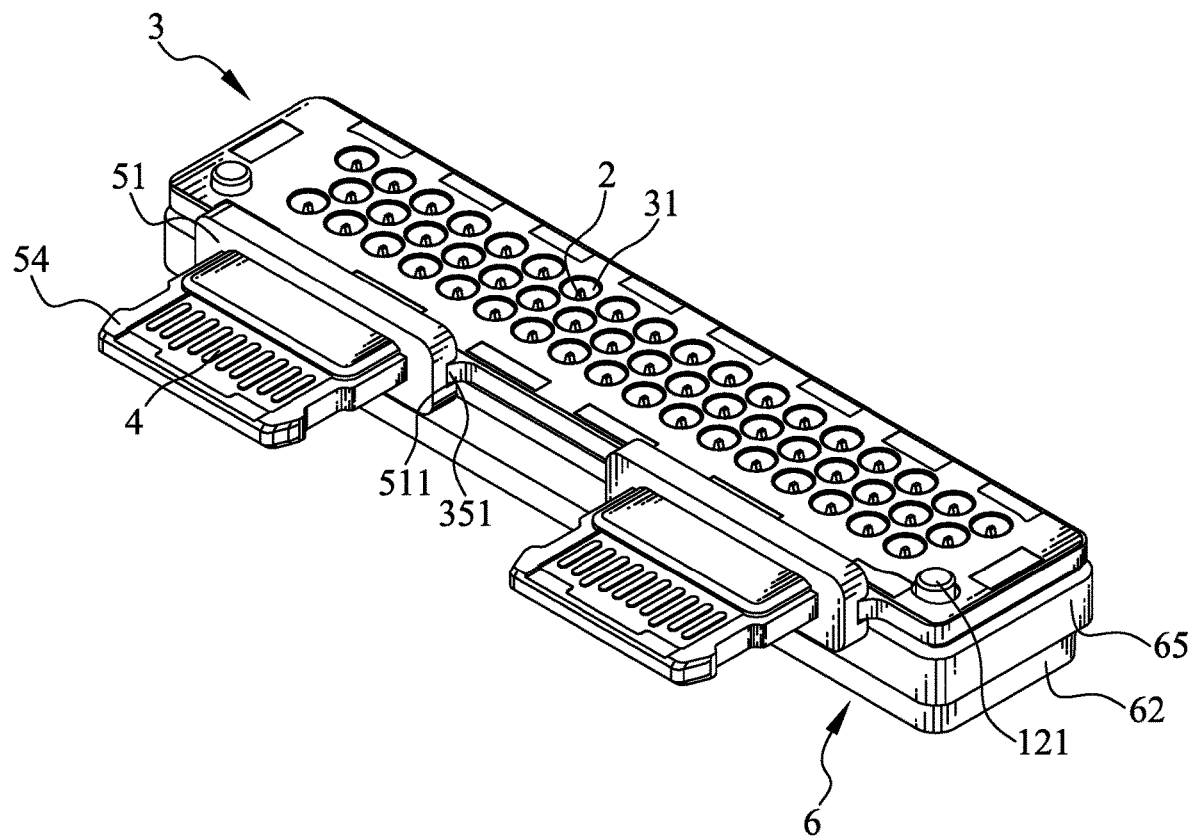
FIG. 7 is a partially assembling perspective view of the electrical connector of FIG. 1.

Referring to FIG. 2 and FIG. 6 again, the at least one connection kit 5 is integrally injection-molded by a MIM (Metal Injection Molding) technology. Then the at least one connection kit 5 is fastened to the circuit board 3. The at least one connection kit 5 sleeves around the at least one tongue board 35 of the circuit board 3. A material of the at least one connection kit 5 is SUS (Steel Use Stainless) 630 (Martensitic Stainless Steel). The at least one connection kit 5 includes a blocking board 51, and a tongue portion 512 protruded frontward from a middle of a front surface of the blocking board 51. Two opposite sides of a rear surface of the blocking board 51 are recessed inward to form two fastening grooves 511 penetrating through two side surfaces of the blocking board 51, respectively. The two fastening grooves 511 are corresponding to the two fastening blocks 351, respectively. A middle of the at least one connection kit 5 defines an insertion space 52 penetrating through middles of the blocking board 51 and the tongue portion 512. Two sides of a rear of the insertion space 52 extend oppositely to form two buckling grooves 53 for buckling the two buckling portions 352. Two sides of the tongue portion 512 extend frontward and then extend towards each other to form a hollow fixing portion 54. The at least one connection kit 5 is of a hollow shape with an accommodating space 541 being surrounded inside the at least one connection kit 5. The accommodating space 541 is formed between the fixing portion 54 and the tongue portion 512. The accommodating space 541 is communicated with the insertion space 52. The at least one tongue board 35 is received in the insertion space 52 and the accommodating space 541. The fixing portion 54 is used for fixing the at least one connection kit 5 to the at least one tongue board 35 of the circuit board 3. The plurality of the golden fingers 4 are exposed out from the accommodating space 541.

Specifically, each of the two connection kits 5 includes the blocking board 51, and the tongue portion 512 protruded frontward from the middle of the front surface of the blocking board 51. A middle of each of the two connection kits 5 defines the insertion space 52 penetrating through the middles of the blocking board 51 and the tongue portion 512. Two sides of the tongue portion 512 extend frontward and then extend towards each other to form the hollow fixing portion 54. The two connection kits 5 are of hollow shapes with two accommodating spaces 541 being surrounded inside the two connection kits 5, respectively. The accommodating space 541 is formed between the fixing portion 54 and the tongue portion 512 of each of the two connection kits 5. The accommodating space 541 is communicated with the insertion space 52. Each of the two connection kits 5 is received in the insertion space 52 and the accommodating space 541. The fixing portions 54 of the two connection kits 5 are used for fixing the two connection kits 5 to the two tongue boards 35 of the circuit board 3, respectively.

Figure 4:
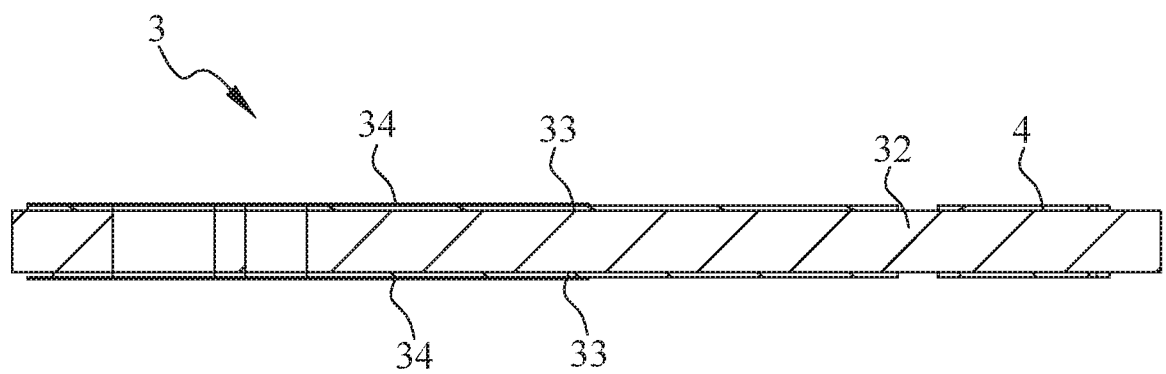
FIG. 4 is a partially enlarged sectional view showing a circuit board of the electrical connector of FIG. 2.
Figure 5:
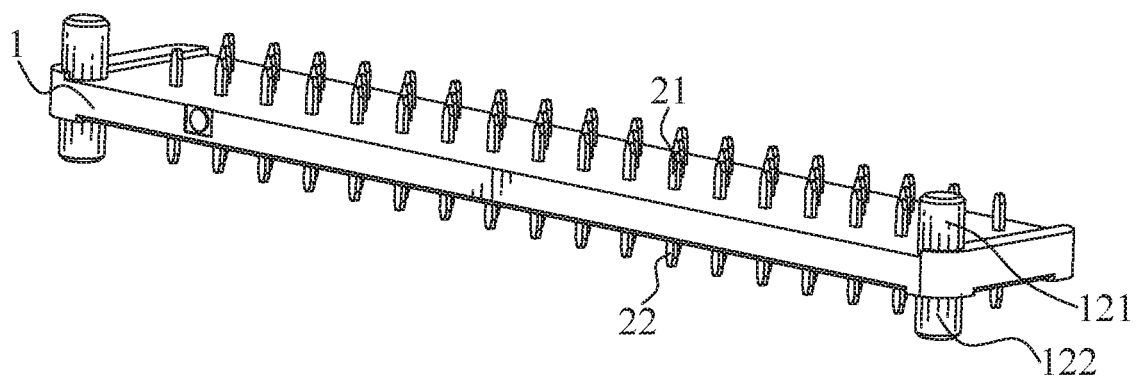
FIG. 5 is an assembling perspective view showing an insulating base and a plurality of conductive terminals of the electrical connector of FIG. 2.

Referring to FIG. 2 to FIG. 4, the outer shell 6 receives the insulating base 1 together with the plurality of the conductive terminals 2 and the circuit board 3. The outer shell 6 has a bottom wall 61, and a peripheral wall 62 protruded upward from a periphery of the bottom wall 61. A top of an outer surface of the peripheral wall 62 protrudes outward and then extends upward to form a protecting wall 65. A rear of the bottom wall 61 protrudes upward to form an inverted U-shaped supporting portion 66 for supporting the insulating base 1. An inside of the outer shell 6 defines two locating grooves 63 corresponding to the two second fastening pillars 122, respectively. Two free ends of the supporting portion 66 are spaced from an inner surface of a front of the peripheral wall 62 to form the two locating grooves 63. The bottom wall 61 of the outer shell 6 opens a plurality of connection holes 64. The connecting portions 22 of the plurality of the conductive terminals 2 are connected with an external component (not shown) through the plurality of the connection holes 64.

The shielding plate 7 is a rectangular metal plate. The shielding plate 7 is assembled on the circuit board 3. Two sides of a front of the shielding plate 7 open two second fastening holes 71 corresponding to the two first fastening pillars 121, respectively. The two second fastening holes 71 are corresponding to the two first fastening holes 36, respectively. An inner surface of the shielding plate 7 facing the circuit board 3 is adhered with a mylar 72. The mylar 72 is used for playing a part in shielding noises so as to prevent internal and external high-frequency noises and electromagnetic interferences. The at least one outer cover 8 is used for surrounding the tongue portion 512 and the fixing portion 54 of the at least one connection kit 5, and the at least one tongue board 35 of the circuit board 3 which are assembled for protecting the plurality of the golden fingers 4 of the at least one tongue board 35 to avoid damaging the plurality of the golden fingers 4 in a transportation process. Specifically, the two outer covers 8 surround the tongue portions 512 and the fixing portions 54 of the two connection kits 5, and the two tongue boards 35 of the circuit board 3. The at least one outer cover 8 has a front plate 81. A periphery of the front plate 81 extends rearward to form a hollow blocking wall 82.

Referring to FIG. 1 to FIG. 7, an assembling process of the electrical connector 100 is described as follows. When the plurality of the conductive terminals 2 are assembled to the insulating base 1, the plurality of the conductive terminals 2 are inserted into and fastened in the plurality of the first through-holes 11 of the insulating base 1. The connecting portions 22 of the plurality of the conductive terminals 2 pass through the plurality of the first through-holes 11 and project under the bottom surface of the insulating base 1. When the connecting portions 22 of the plurality of the conductive terminals 2 are kept being inserted downward along the plurality of the first through-holes 11 separately, the two interfering portions 231 of the fastening portion 23 of each of the plurality of the conductive terminals 2 are interfered with an inner side wall of one of the plurality of the first through-holes 11, so that the fastening portions 23 of the plurality of the conductive terminals 2 are received in and fastened in the plurality of the first through-holes 11, separately. In this way, the plurality of the conductive terminals 2 are fastened in the plurality of the first through-holes 11 of the insulating base 1, separately. The conducting portions 21 of the plurality of the conductive terminals 2 are exposed out of the plurality of the first through-holes 11 and project beyond the top surface of the insulating base 1.

In an insertion and withdrawal process of the electrical connector 100, comparing the SUS 630 material of the at least one connection kit 5 with a material of the circuit board 3 which is mainly a bakelite plate, a glass fibre board or one of a variety of plastic boards, the SUS 630 material of the at least one connection kit 5 is more wear-resisting to make a usage life of the circuit board 3 increased. Except for the above-mentioned structure, inner surfaces of a top wall and a bottom wall of the insertion space 52 define a plurality of ditches transversely arranged in two rows to form two serration-shaped auxiliary portions 531 for increasing soldering wicking areas of the inner surfaces of the top wall and the bottom wall of the insertion space 52, respectively. When the at least one connection kit 5 is assembled to the circuit board 3, the two fastening blocks 351 of the circuit board 3 are fastened in the two fastening grooves 511 of the at least one connection kit 5, respectively. The two serration-shaped auxiliary portions 531 of the inner surfaces of the top wall and the bottom wall of the insertion space 52 of the at least one connection kit 5 and the fusion surfaces 331 of the two metal layers 33 of the at least one tongue board 35 are merged together and fastened with each other by use of solder pastes. Specifically, the fastening blocks 351 of the circuit board 3 are fastened in the fastening grooves 511 of the two connection kits 5. The two serration-shaped auxiliary portions 531 of the inner surfaces of the top wall and the bottom wall of the insertion space 52 of each of the two connection kits 5 and the fusion surfaces 331 of the two metal layers 33 of the one of the two tongue boards 35 are merged together and fastened with each other by use of the solder pastes.

The plurality of the conductive terminals 2 are inserted to the circuit board 3. The conducting portions 21 of the plurality of the conductive terminals 2 are received in and inserted into the plurality of the second through-holes 31 of the circuit board 3. After the solder pastes are melted in the second through-holes 31 of the circuit board 3, the plurality of the conductive terminals 2 are fastened in the plurality of the second through-holes 31 of the circuit board 3 and the plurality of the conductive terminals 2 are connected with the circuit board 3 by virtue of a surface mount technology (SMT).

The two first fastening pillars 121 of the insulating base 1 are fastened in and project out of the two first fastening holes 36 of the circuit board 3, respectively. The circuit board 3 is assembled to and fastened to the insulating base 1 by virtue of the two first fastening pillars 121 of the insulating base 1 being fastened in the two first fastening holes 36 of the circuit board 3, respectively. The outer shell 6 is assembled upward to the insulating base 1 together with the circuit board 3 to surround the insulating base 1 together with the circuit board 3. The two second fastening pillars 122 of the insulating base 1 are assembled in and fastened in the two locating grooves 63 of the outer shell 6. The connecting portions 22 of the plurality of the conductive terminals 2 are disposed in the outer shell 6. The shielding plate 7 is covered on the circuit board 3 to make the insulating base 1 and the circuit board 3 sealed between the shielding plate 7 and the outer shell 6. The two first fastening pillars 121 of the insulating base 1 are assembled to and fastened in the two second fastening holes 71 of the shielding plate 7. The shielding plate 7 is defined as a top cover of the electrical connector 100.

As described above, in the insertion and withdrawal process of the electrical connector 100, the circuit board 3 is protected from abrasions by virtue of the at least one connection kit 5 being integrally injection-molded by the metal injection molding technology and the at least one connection kit 5 being fastened to the circuit board 3, so the usage life of the circuit board 3 is increased, and simultaneously, the shielding plate 7 is utilized by the electrical connector 100 for preventing the internal and external high-frequency noises and the electromagnetic interferences. As a result, a steady transmission of the electrical connector 100 is realized.

What is claimed is:

1. An electrical connector, comprising:
   an insulating base;
   a plurality of conductive terminals inserted to the insulating base and arranged at regular intervals;
   a circuit board mounted on the insulating base, the plurality of the conductive terminals being inserted to the circuit board, at least one portion of one end of the circuit board extending outward away from a center of the circuit board to form at least one tongue board, a front end of at least one surface of the at least one tongue board having a plurality of spaced golden fingers arranged side by side, the plurality of the golden fingers being connected with the plurality of the conductive terminals by circuits of the circuit board;
   at least one connection kit integrally injection-molded by a metal injection molding technology, the at least one connection kit sleeving around the at least one tongue board of the circuit board, the at least one connection kit being of a hollow shape with an accommodating space being surrounded inside the at least one connection kit, the plurality of the golden fingers being exposed out from the accommodating space;
   an outer shell receiving the insulating base together with the plurality of the conductive terminals and the circuit board; and
   a shielding plate covered on the circuit board to make the insulating base and the circuit board sealed between the shielding plate and the outer shell.

2. The electrical connector as claimed in claim 1, wherein a middle of the insulating base opens a plurality of first through-holes, the plurality of the conductive terminals are inserted into and fastened in the plurality of the first through-holes.

3. The electrical connector as claimed in claim 2, wherein the circuit board is a rectangular board, a middle of the circuit board opens a plurality of second through-holes corresponding to the plurality of the first through-holes separately, each of the plurality of the conductive terminals has a conducting portion, a connecting portion, and a fastening portion connected between the conducting portion and the connecting portion, each of the plurality of the conductive terminals is of a linear cylinder shape, the fastening portions of the plurality of the conductive terminals are received in and fastened in the plurality of the first through-holes, separately, the conducting portions of the plurality of the conductive terminals are received in and inserted into the plurality of the second through-holes, the connecting portions of the plurality of the conductive terminals are disposed in the outer shell.

4. The electrical connector as claimed in claim 1, wherein the circuit board includes a main body, two metal layers and two coating layers, a top surface and a bottom surface of the main body are coated with the two metal layers, respectively, one of the two coating layers is coated on one of the two metal layers, and the other coating layer is coated under the other metal layer.

5. The electrical connector as claimed in claim 4, wherein each of the two metal layers of the at least one tongue board extends frontward to a middle of the at least one tongue board to form a fusion surface covered to a latter half of the at least one tongue board.

6. The electrical connector as claimed in claim 1, wherein two opposite sides of a front of a top surface of the insulating base protrude upward to form two first fastening pillars, two opposite sides of a front of a bottom surface of the insulating base protrude downward to form two second fastening pillars, two sides of the circuit board open two first fastening holes, two sides of a front of the shielding plate open two second fastening holes, the two first fastening pillars are fastened in and project out of the two first fastening holes, respectively, an inside of the outer shell defines two locating grooves, the outer shell is assembled upward to the insulating base together with the circuit board to surround the insulating base together with the circuit board, the two second fastening pillars are assembled in and fastened in the two locating grooves, the two first fastening pillars are assembled to and fastened in the two second fastening holes.

7. The electrical connector as claimed in claim 1, wherein a middle of the at least one connection kit defines an insertion space, the at least one connection kit includes a blocking board, and a tongue portion protruded frontward from a middle of a front surface of the blocking board, two sides of the tongue portion extend frontward and then extend towards each other to form a hollow fixing portion, an accommodating space is formed between the fixing portion and the tongue portion, the at least one tongue board is received in the insertion space and the accommodating space.

8. The electrical connector as claimed in claim 7, wherein the circuit board includes a main body, two portions of a front surface of the main body protrude frontward to form two fastening blocks, the at least one tongue board is located between the two fastening blocks, two opposite sides of a rear surface of the blocking board of the at least one connection kit are recessed inward to form two fastening grooves penetrating through two side surfaces of the blocking board, respectively, the two fastening blocks of the circuit board are fastened in the two fastening grooves of the at least one connection kit, respectively.

9. The electrical connector as claimed in claim 1, wherein the shielding plate is a rectangular metal plate, an inner surface of the shielding plate facing the circuit board is adhered with a mylar.

10. The electrical connector as claimed in claim 1, further comprising at least one outer cover surrounding the at least one connection kit and the at least one tongue board of the circuit board, the at least one outer cover having a front plate, a periphery of the front plate extending rearward to form a hollow blocking wall.

* * * * *